US007523249B1

(12) United States Patent
Estakhri et al.

(10) Patent No.: US 7,523,249 B1

(45) Date of Patent: *Apr. 21, 2009

(54) DIRECT LOGICAL BLOCK ADDRESSING FLASH MEMORY MASS STORAGE ARCHITECTURE

(75) Inventors: Petro Estakhri, Pleasanton, CA (US); Mahmud Assar, Morgan Hill, CA (US)

(73) Assignee: Lexar Media, Inc., Fremont, CA (US)

( * ) Notice: Subject to any disclaimer, the term of this patent is extended or adjusted under 35 U.S.C. 154(b) by 633 days.

This patent is subject to a terminal disclaimer.

(21) Appl. No.: 11/165,864

(22) Filed: Jun. 24, 2005

Related U.S. Application Data

(63) Continuation of application No. 09/850,790, filed on May 7, 2001, now Pat. No. 6,912,618, which is a continuation of application No. 09/521,420, filed on Mar. 8, 2000, now Pat. No. 6,230,234, which is a continuation of application No. 09/311,045, filed on May 13, 1999, now Pat. No. 6,115,785, which is a continuation of application No. 09/087,720, filed on May 29, 1998, now Pat. No. 5,924,113, which is a continuation of application No. 08/509,706, filed on Jul. 31, 1995, now Pat. No. 5,845,313.

(51) Int. Cl.
*G06F 12/10* (2006.01)

(52) U.S. Cl. ....................... 711/103; 711/104; 711/156; 711/203

(58) Field of Classification Search ....................... None
See application file for complete search history.

(56) References Cited

U.S. PATENT DOCUMENTS 4,099,069 A 7/1978 Cricchi et al.

(Continued)

FOREIGN PATENT DOCUMENTS

AU 0 557 723 1/1987

(Continued)

OTHER PUBLICATIONS

Book—*Computer Architecture and Parallel Processing*, Kai Hwang & Faye A. Briggs, McGraw-Hill Book Co., © 1984, p. 64.

(Continued)

*Primary Examiner*—Kevin Verbrugge
*Assistant Examiner*—Eric S Cardwell
(74) *Attorney, Agent, or Firm*—Leffert Jay & Polglaze P.A.

(57) ABSTRACT

A nonvolatile semiconductor mass storage system and architecture can be substituted for a rotating hard disk. The system and architecture avoid an erase cycle each time information stored in the mass storage is changed. Erase cycles are avoided by programming an altered data file into an empty mass storage block rather than over itself as a hard disk would. Periodically, the mass storage will need to be cleaned up. These advantages are achieved through the use of several flags, and a map to correlate a logical block address of a block to a physical address of that block. In particular, flags are provided for defective blocks, used blocks, and old versions of a block. An array of volatile memory is addressable according to the logical address and stores the physical address.

22 Claims, 5 Drawing Sheets

U.S. PATENT DOCUMENTS 4,130,900 A 12/1978 Watanabe
4,210,959 A 7/1980 Wozniak ..................... 364/200
4,309,627 A 1/1982 Tabata
4,355,376 A 10/1982 Gould ........................ 365/230
4,398,248 A 8/1983 Hsia et al.
4,405,952 A 9/1983 Slakmon ...................... 360/49
4,414,627 A 11/1983 Nakamura
4,450,559 A 5/1984 Bond et al. ................... 371/10
4,456,971 A 6/1984 Fukuda et al. .............. 364/900
4,468,730 A 8/1984 Dodd et al.
4,473,878 A 9/1984 Zolnowsky et al.
4,476,526 A 10/1984 Dodd
4,498,146 A 2/1985 Martinez .................... 364/900
4,525,839 A 6/1985 Nozawa et al. ................ 371/38
4,532,590 A 7/1985 Wallach et al.
4,609,833 A 9/1986 Gutterman
4,616,311 A 10/1986 Sato .......................... 364/200
4,654,847 A 3/1987 Dutton ........................ 371/10
4,710,871 A 12/1987 Belknap et al. ............. 364/200
4,746,998 A 5/1988 Robinson et al. ........... 360/72.1
4,748,320 A 5/1988 Yorimoto et al. ............ 235/492
4,757,474 A 7/1988 Fukushi et al. ............. 365/189
4,774,700 A 9/1988 Satoh et al. ................... 369/54
4,780,855 A 10/1988 Iida et al.
4,788,665 A 11/1988 Fukuda et al.
4,797,543 A 1/1989 Watanabe
4,800,520 A 1/1989 Iijima ......................... 364/900
4,829,169 A 5/1989 Watanabe
4,843,224 A 6/1989 Ohta et al.
4,896,262 A 1/1990 Wayama et al. ............. 364/200
4,914,529 A 4/1990 Bonke ......................... 360/48
4,920,518 A 4/1990 Nakamura et al. .......... 365/228
4,924,331 A 5/1990 Robinson et al. ........... 360/72.1
4,943,745 A 7/1990 Watanabe et al.
4,953,122 A 8/1990 Williams .................... 364/900
4,970,642 A 11/1990 Yamamura
4,970,727 A 11/1990 Miyawaki et al.
5,070,474 A 12/1991 Tuma et al. ................. 395/500
5,093,785 A 3/1992 Iijima
5,168,465 A 12/1992 Harari ........................ 257/320
5,198,380 A 3/1993 Harari ......................... 437/43
5,200,959 A 4/1993 Gross et al. ................ 371/21.6
5,218,695 A 6/1993 Noveck et al.
5,220,518 A 6/1993 Haq
5,226,168 A 7/1993 Kobayashi et al. .......... 395/800
5,227,714 A 7/1993 Lou
5,253,351 A 10/1993 Yamamoto et al.
5,267,218 A 11/1993 Elbert
5,268,318 A 12/1993 Harari ......................... 437/43
5,268,870 A 12/1993 Harari ........................ 365/218
5,270,979 A 12/1993 Harari et al. ................ 365/218
5,293,560 A 3/1994 Harari ........................ 365/185
5,297,148 A 3/1994 Harari et al. ............... 371/10.2
5,303,198 A 4/1994 Adachi et al. ............... 365/218
5,305,276 A 4/1994 Uenoyama
5,305,278 A 4/1994 Inoue
5,315,541 A 5/1994 Harari et al. .................. 365/63
5,315,558 A 5/1994 Hag
5,329,491 A 7/1994 Brown et al.
5,337,275 A 8/1994 Garner .................. 365/189.01
5,341,330 A 8/1994 Wells et al. ................. 365/185
5,341,339 A 8/1994 Wells ......................... 365/218
5,341,341 A 8/1994 Fukazo
5,353,256 A 10/1994 Fandrich et al. ........ 365/230.03
5,357,475 A 10/1994 Hasbun et al. .............. 365/218
5,359,569 A 10/1994 Fujita et al.
5,365,127 A 11/1994 Manley
5,369,615 A 11/1994 Harari et al. ................ 365/218
5,371,702 A 12/1994 Nakai et al.
5,381,539 A 1/1995 Yanai et al.
5,382,839 A 1/1995 Shinohara
5,384,743 A 1/1995 Rouy
5,388,083 A 2/1995 Assar et al. ................. 365/218
5,396,468 A 3/1995 Harari et al. ................ 365/218
5,404,485 A 4/1995 Ban
5,406,527 A 4/1995 Honma
5,418,752 A 5/1995 Harari et al. ................ 365/218
5,422,842 A 6/1995 Cernea et al. ............... 365/185
5,422,856 A 6/1995 Sasaki et al.
5,428,621 A 6/1995 Mehrotra et al. ........... 371/21.4
5,430,682 A 7/1995 Ishikawa et al.
5,430,859 A 7/1995 Norman et al. ............. 395/425
5,431,330 A 7/1995 Wieres
5,434,825 A 7/1995 Harari ........................ 365/185
5,438,573 A 8/1995 Mangan et al. ............. 371/10.3
5,465,235 A 11/1995 Miyamoto
5,465,338 A 11/1995 Clay
5,471,478 A 11/1995 Mangan et al. ............. 371/10.3
5,473,765 A 12/1995 Gibbons et al.
5,479,638 A 12/1995 Assar et al. ................. 395/430
5,485,595 A * 1/1996 Assar et al. ................. 711/103
5,490,117 A 2/1996 Oda et al.
5,495,442 A 2/1996 Cernea et al. .......... 365/185.03
5,504,760 A 4/1996 Harari et al. ............... 371/40.1
5,508,971 A 4/1996 Cernea et al. .......... 365/185.23
5,513,138 A 4/1996 Manabe et al.
5,515,333 A 5/1996 Fujita et al.
5,519,847 A 5/1996 Fandrich et al.
5,523,980 A 6/1996 Sakui et al.
5,524,230 A 6/1996 Sakaue et al. ............... 395/430
5,530,673 A 6/1996 Tobita et al.
5,530,828 A 6/1996 Kaki et al.
5,530,938 A 6/1996 Akasaka et al.
5,532,962 A 7/1996 Auclair et al. .............. 365/201
5,532,964 A 7/1996 Cernea et al. .......... 365/189.09
5,534,456 A 7/1996 Yuan et al. .................... 437/43
5,535,328 A 7/1996 Harari et al. ........... 395/182.05
5,541,551 A 7/1996 Brehner et al.
5,544,118 A 8/1996 Harari ........................ 365/218
5,544,356 A 8/1996 Robinson et al. ............ 395/600
5,552,698 A 9/1996 Tai et al.
5,554,553 A 9/1996 Harari ......................... 437/43
5,563,825 A 10/1996 Cernea et al. .......... 365/185.18
5,566,314 A 10/1996 DeMarco et al. ............ 395/430
5,568,439 A 10/1996 Harari ........................ 365/218
5,572,466 A 11/1996 Sukegawa
5,579,502 A 11/1996 Konishi et al.
5,581,723 A * 12/1996 Hasbun et al. .............. 711/103
5,583,812 A 12/1996 Harari ................... 365/185.33
5,592,415 A 1/1997 Kato et al.
5,592,420 A 1/1997 Cernea et al. .......... 365/185.18
5,596,526 A 1/1997 Assar et al.
5,598,370 A 1/1997 Niisima et al.
5,602,987 A 2/1997 Harari et al.
5,603,001 A * 2/1997 Sukegawa et al. ........... 711/103
5,606,660 A 2/1997 Estakhri et al.
5,611,067 A 3/1997 Okamoto et al.
5,640,528 A 6/1997 Harney et al.
5,642,312 A 6/1997 Harari ................... 365/185.33
5,648,929 A 7/1997 Miyamoto
5,663,901 A 9/1997 Wallace et al. ................ 365/52
5,693,570 A 12/1997 Cernea et al. ............... 437/205
5,712,819 A 1/1998 Harari ................... 365/185.29
5,719,808 A 2/1998 Harari et al. ........... 365/185.33
5,723,990 A 3/1998 Roohparvar
5,734,567 A 3/1998 Griffiths et al.
5,745,418 A 4/1998 Ma et al.
5,754,567 A 5/1998 Norman
5,757,712 A 5/1998 Nagel et al.
5,758,100 A 5/1998 Odisho
5,761,117 A 6/1998 Uchino et al.
5,768,190 A 6/1998 Tanaka et al.
5,768,195 A 6/1998 Nakamura et al.
5,773,901 A 6/1998 Kanter

| | | | | |
|---|---|---|---|---|
| 5,778,418 | A | 7/1998 | Auclair et al. | .............. 711/101 |
| 5,781,478 | A | 7/1998 | Takeeuchi et al. | |
| 5,787,445 | A | 7/1998 | Daberko | |
| 5,787,484 | A | 7/1998 | Norman | |
| RE35,881 | E | 8/1998 | Barrett et al. | |
| 5,799,168 | A | 8/1998 | Ban | |
| 5,802,551 | A | 9/1998 | Komatsu et al. | |
| 5,809,515 | A | 9/1998 | Kaki et al. | |
| 5,809,558 | A | 9/1998 | Matthews et al. | |
| 5,809,560 | A | 9/1998 | Schneider | |
| 5,818,350 | A | 10/1998 | Estakhri et al. | |
| 5,818,781 | A | 10/1998 | Estakhri et al. | |
| 5,822,245 | A | 10/1998 | Gupta et al. | |
| 5,822,252 | A | 10/1998 | Lee et al. | |
| 5,822,781 | A | 10/1998 | Wells et al. | |
| 5,831,929 | A | 11/1998 | Manning | |
| 5,835,935 | A | 11/1998 | Estakhri et al. | |
| 5,838,614 | A | 11/1998 | Estakhri et al. | |
| 5,845,313 | A | 12/1998 | Estakhri et al. | |
| 5,847,552 | A | 12/1998 | Brown | |
| 5,860,083 | A | 1/1999 | Sukeawa | |
| 5,860,124 | A | 1/1999 | Matthews et al. | |
| 5,862,099 | A | 1/1999 | Gannage et al. | |
| 5,890,192 | A | 3/1999 | Lee et al. | |
| 5,901,086 | A | 5/1999 | Wang et al. | |
| 5,907,856 | A | 5/1999 | Estakhri et al. | |
| 5,909,586 | A | 6/1999 | Anderson | |
| 5,920,884 | A | 7/1999 | Jennings, III et al. | |
| 5,924,113 | A | 7/1999 | Estakhri et al. | |
| 5,928,370 | A | 7/1999 | Asnaashari | |
| 5,930,815 | A | 7/1999 | Estakhri et al. | |
| 5,933,368 | A | 8/1999 | Ma et al. | |
| 5,933,846 | A | 8/1999 | Endo | |
| 5,936,971 | A | 8/1999 | Harari et al. | |
| 5,937,425 | A | 8/1999 | Ban | |
| 5,953,737 | A | 9/1999 | Estakhri et al. | |
| 5,956,473 | A | 9/1999 | Ma et al. | |
| 5,959,926 | A | 9/1999 | Jones et al. | |
| 5,966,727 | A | 10/1999 | Nishino et al. | |
| 5,986,933 | A | 11/1999 | Takeuchi et al. | |
| 5,987,563 | A | 11/1999 | Itoh et al. | |
| 5,987,573 | A | 11/1999 | Hiraka | |
| 5,991,849 | A | 11/1999 | Yamada et al. | |
| 6,011,322 | A | 1/2000 | Hiraka | |
| 6,011,323 | A | 1/2000 | Camp | |
| 6,018,265 | A | 1/2000 | Keshtbod | |
| 6,021,408 | A | 2/2000 | Ledain et al. | |
| 6,026,020 | A | 2/2000 | Matsubara et al. | |
| 6,026,027 | A | 2/2000 | Terrell, II et al. | |
| 6,034,897 | A | 3/2000 | Estakhri et al. | |
| 6,035,357 | A | 3/2000 | Sakaki | |
| 6,040,997 | A | 3/2000 | Estakhri | |
| 6,041,001 | A | 3/2000 | Estakhri | |
| 6,047,352 | A | 4/2000 | Lakhani et al. | |
| 6,055,184 | A | 4/2000 | Acharya et al. | |
| 6,055,188 | A | 4/2000 | Takeuchi et al. | |
| 6,069,827 | A | 5/2000 | Sinclair | |
| 6,072,796 | A | 6/2000 | Christensen et al. | |
| 6,076,137 | A | 6/2000 | Asnaashari | |
| 6,081,447 | A | 6/2000 | Lofgren et al. | |
| 6,081,878 | A | 6/2000 | Estakhri et al. | |
| 6,084,483 | A | 7/2000 | Keshtbod | |
| 6,097,666 | A | 8/2000 | Sakui et al. | |
| 6,115,785 | A | 9/2000 | Estakhri et al. | |
| 6,122,195 | A | 9/2000 | Estakhri et al. | |
| 6,125,424 | A | 9/2000 | Komatsu et al. | |
| 6,125,435 | A | 9/2000 | Estakhri et al. | |
| 6,128,695 | A | 10/2000 | Estakhri et al. | |
| 6,134,145 | A | 10/2000 | Wong | |
| 6,134,151 | A | 10/2000 | Estakhri et al. | |
| 6,141,249 | A | 10/2000 | Estakhri et al. | |
| 6,145,051 | A | 11/2000 | Estakhri et al. | |
| 6,151,247 | A | 11/2000 | Estakhri et al. | |
| 6,172,906 | B1 | 1/2001 | Estakhri et al. | |
| 6,173,362 | B1 | 1/2001 | Yoda | |
| 6,181,118 | B1 | 1/2001 | Meehan et al. | |
| 6,182,162 | B1 | 1/2001 | Estakhri et al. | |
| 6,202,138 | B1 | 3/2001 | Estakhri et al. | |
| 6,223,308 | B1 | 4/2001 | Estakhri et al. | |
| 6,226,708 | B1 | 5/2001 | McGoldrick et al. | |
| 6,230,234 | B1 | 5/2001 | Estakhri et al. | |
| 6,262,918 | B1 | 7/2001 | Estakhri et al. | |
| 6,272,610 | B1 | 8/2001 | Katayama et al. | |
| 6,275,436 | B1 | 8/2001 | Tobita et al. | |
| 6,279,069 | B1 | 8/2001 | Robinson et al. | |
| 6,279,114 | B1 | 8/2001 | Toombs et al. | |
| 6,285,607 | B1 | 9/2001 | Sinclair | |
| 6,327,639 | B1 | 12/2001 | Asnaashari | |
| 6,345,367 | B1 | 2/2002 | Sinclair | |
| 6,374,337 | B1 | 4/2002 | Estakhri | |
| 6,385,667 | B1 | 5/2002 | Estakhri et al. | |
| 6,393,513 | B2 | 5/2002 | Estakhri et al. | |
| 6,397,314 | B1 | 5/2002 | Estakhri et al. | |
| 6,411,546 | B1 | 6/2002 | Estakhri et al. | |
| 6,467,021 | B1 | 10/2002 | Sinclair | |
| 6,490,649 | B2 | 12/2002 | Sinclair | |
| 6,567,307 | B1 | 5/2003 | Estakhri | |
| 6,578,127 | B1 | 6/2003 | Sinclair | |
| 6,587,382 | B1 | 7/2003 | Estakhri et al. | |
| 6,711,059 | B2 | 3/2004 | Sinclair et al. | |
| 6,721,819 | B2 | 4/2004 | Estakhri et al. | |
| 6,721,843 | B1 | 4/2004 | Estakhri | |
| 6,725,321 | B1 | 4/2004 | Sinclair et al. | |
| 6,728,851 | B1 | 4/2004 | Estakhri et al. | |
| 6,751,155 | B2 | 6/2004 | Gorobets | |
| 6,757,800 | B1 | 6/2004 | Estakhri et al. | |
| 6,772,274 | B1 | 8/2004 | Estakhri | |
| 6,813,678 | B1 | 11/2004 | Sinclair et al. | |
| 6,898,662 | B2 | 5/2005 | Gorobets | |
| 6,912,618 | B2 | 6/2005 | Estakhri et al. | |
| 6,950,918 | B1 | 9/2005 | Estakhri | |
| 6,957,295 | B1 | 10/2005 | Estakhri | |
| 6,973,519 | B1 | 12/2005 | Estakhri et al. | |
| 6,978,342 | B1 | 12/2005 | Estakhri et al. | |
| 7,000,064 | B2 | 2/2006 | Payne et al. | |
| 2003/0033471 | A1 | 2/2003 | Lin et al. | |

FOREIGN PATENT DOCUMENTS

| | | | |
|---|---|---|---|
| EM | RM-37697 | | 2/1996 |
| EP | 0 220 718 | A2 | 5/1987 |
| EP | 0 243 503 | A1 | 11/1987 |
| EP | 0 392 895 | A2 | 10/1990 |
| EP | 0 424 191 | A2 | 4/1991 |
| EP | 0 489 204 | A1 | 6/1992 |
| EP | 0 522 780 | A2 | 1/1993 |
| EP | 0 522 780 | B1 | 1/1993 |
| EP | 0 544 252 | A2 | 6/1993 |
| EP | 0 613 151 | A2 | 8/1994 |
| EP | 0 617 363 | A2 | 9/1994 |
| EP | 0 619 541 | A2 | 10/1994 |
| EP | 0 663 636 | A1 | 7/1995 |
| EP | 0 686 976 | A2 | 12/1995 |
| EP | 0 897 579 | B1 | 7/2000 |
| EP | 0 891 580 | B1 | 11/2000 |
| EP | 0 896 699 | B1 | 11/2000 |
| EP | 0 852 766 | B1 | 5/2001 |
| EP | 0 852 765 | B1 | 9/2001 |
| EP | 0 722 585 | B1 | 5/2002 |
| EP | 0 910 826 | B1 | 6/2002 |
| EP | 0 691 008 | B1 | 11/2002 |
| EP | 0 861 468 | B1 | 4/2003 |
| EP | 0 978 040 | B1 | 5/2004 |
| EP | 1 157 328 | B1 | 5/2005 |
| FR | 93 01908 | | 8/1993 |
| GB | 2 251 323 | | 7/1992 |

| | | | |
|---|---|---|---|
| GB | 2 291 990 | | 2/1996 |
| GB | 2 291 991 | A | 7/1996 |
| GB | 2 297 637 | A | 7/1996 |
| GB | 2 304 428 | | 3/1997 |
| GB | 2 348 991 | B | 12/2002 |
| GB | 2 351 822 | B | 1/2003 |
| GB | 2 384 337 | A | 7/2003 |
| GB | 2 384 883 | A | 10/2005 |
| GB | 2 384 338 | B | 11/2005 |
| GB | 2 384 072 | B | 12/2005 |
| GB | 2 411 499 | B | 2/2006 |
| IS | 117881 | | 5/2003 |
| JP | 3-228377 | | 10/1981 |
| JP | 59-45695 | A | 9/1982 |
| JP | 58-215794 | A | 12/1983 |
| JP | 58-215795 | A | 12/1983 |
| JP | 59-92483 | | 5/1984 |
| JP | 59-162695 | A | 9/1984 |
| JP | 60-212900 | | 10/1985 |
| JP | 61-96598 | A | 5/1986 |
| JP | 62-283496 | A | 12/1987 |
| JP | 62-283497 | A | 12/1987 |
| JP | 63-183700 | A | 7/1988 |
| JP | 1-138694 | | 5/1989 |
| JP | 4-57295 | | 2/1992 |
| JP | 4-254994 | | 9/1992 |
| JP | 4-268284 | | 9/1992 |
| JP | 4-278297 | | 10/1992 |
| JP | 4-332999 | A | 11/1992 |
| JP | 5-128877 | | 5/1993 |
| JP | 5-282883 | | 10/1993 |
| JP | 6-4399 | | 1/1994 |
| JP | 6-36578 | | 2/1994 |
| JP | 6-124175 | | 5/1994 |
| JP | 6-124231 | | 5/1994 |
| JP | 6-131889 | | 5/1994 |
| JP | 6-132747 | | 5/1994 |
| JP | 6-149395 | | 5/1994 |
| JP | 6-266596 | | 9/1994 |
| JP | 7-84871 | | 3/1995 |
| JP | 7-93499 | | 4/1995 |
| JP | 7-114499 | | 5/1995 |
| JP | 7-141258 | | 6/1995 |
| JP | 7-235193 | | 9/1995 |
| JP | 7-311708 | | 11/1995 |
| JP | 7-334996 | | 12/1995 |
| JP | 8-18018 | | 1/1996 |
| JP | 8-69696 | | 3/1996 |
| JP | 9-147581 | | 6/1997 |
| SU | 1388877 | A1 | 4/1988 |
| SU | 1408439 | A1 | 7/1988 |
| SU | 1515164 | A1 | 10/1989 |
| SU | 1541619 | A1 | 2/1990 |
| SU | 1573458 | A2 | 6/1990 |
| SU | 1686449 | A2 | 10/1991 |
| WO | 84/00628 | | 2/1984 |
| WO | WO 94/20906 | | 9/1994 |

OTHER PUBLICATIONS

Magazine—"State of the Art; Magnetic VS. Optical Store Data in a Flash", by Walter Lahti and Dean McCarron, Byte magazine dated Nov. 1, 1990. 311, vol. 15, No. 12.

Magazine—Technology Updates, Integrated Cirrcuits, "1-Mbit flash memories seek their role in system design", Ron Wilson, Senior Editor, Computer Design magazine 28 (1989) Mar. 1, No. 5, Tulsa OK, US, pp. 30 and 32.

1992 Symposium of VLSI Circuits Digest of Technical Papers, "EEPROM for Solid State Disk Applications", S. Mehoura et al., SunDisk Corporation, Santa Clara, CA. R.W. Gregor et al., AT&T Bell Laboratories, Allentown, PA. pp. 24 and 25.

Mendel Rosenblum and John K. Ousterhout, The Design and Implementation of a Log-Structured File System, article, 1991, 15 pgs., Berkeley, USA.

Brian Dipert and Markus Levy, Designing with Flash Memory, book, Apr. 1994, 445 pgs., Annabooks, San Diego, USA.

Science Forum, INC., Flash Memory Symposium '95, symposium, 1995, 13 pgs.; Hongo, Bunkyo-ku, Tokyo.

Ross S. Finlayson and David R. Cheriton, An Extended File Service Exploiting Write-Once Storage, article, 1987, 10 pgs. ACM.

Jason Gait, The Optical File Cabinet: A Random-Access File System for Write-Once Optical Disks, article, Jun. 1988, 12 pgs., Beaverton, Oregon.

Henry G Baker, Memory Management, book, 1995, 19 pgs., Springer-Verlag Berlin Heidelberg, Germany.

Sape J. Mullender and Andrew S. Tanenbaum, A Distributed File Service Based on Optimistic Concurrency Control, article, 1985, 12 pgs., ACM.

Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers., 2 pgs.

Hiroshi Nakamura, Junichi Miyamoto, Kenichi Imamiya, Yoshihisa Iwata, Yoshihisa Sugiura and Hideko Oodaria, A Novel Sensing Scheme with On-Chip Page Copy for Flexible Voltage NAND Flash Memories, article, Jun. 1996, 9 pgs . . . vol. E79-C, No.6.

Takaaki Nozaki, Toshiaki Tanaka, Yoshiro Kijiya, Eita Kinoshita, Tatsuo Tsuchiya and Yutaka Hayashi, A 1-Mb EEPROM with MONOS Memory Cell for Semiconductor Disk Application, article, 1991, 5 pgs., Journal Of Solid-State Circuits, vol.,26, No. 4.

Kai Hwang and Faye A. Briggs, Computer Architecture and Parallel Processing, book, 1984, McGraw-Hill, Inc., 2 pgs., US.

Walter Lahti and Dean McCarron, State of the Art: Magnetic VS. Optical Store Data in a Flash, article, 1990, 7 pgs., Vol. 15, No. 12, McGraw-Hill, Inc., US.

Ron Wilson, Integrated Circuits; 1-Mbit flash memories seek their role in system design, article, Mar. 1, 1989, 2 pgs., No.6, Tulsa, OK.

S. Mehroura, J.H. Yuan, R.A. Cemea, W.Y. Chien, D.C. Guteman, G. Samachisa, R.D. Noman, M. Mofidi, W.Lee, Y. Fong, A. Mihnea, E. Hann, R.W. Gregor, E.P. Eberhardt, J.R. Radosevich, K.R. Stiles, R.A. Kohler, C.W. Leung, and T.J. Mulrooney, Serial 9Mb F EEPROM for Solid State Disk Applications, symposium, 1992, 2 pgs., Mountain View, CA.

Steven H. Leibson, Nonvolatile, in-circuit-reprogrammable memories, article. Jan. 3, 1991, 12 pgs., EDN, Circle No. 12.

Walter Lahti and Dean McCarron, State of the Art: Magnetic VS. Optical Store Data in a Flash, article, 1990, 7 pgs., vol. 15, No. 12, McGraw-Hill, Inc., US.

Kai Hwang and Faye A. Briggs, Computer Architecture and Parallel Processing, book, 1984, McGraw-Hill, Inc., 2 pgs., US.

Steven H. Leibson, Nonvolatile, in-circuit-reprogrammable memories, article, Jan. 3, 1991, 12 pgs., EDN, Circle No. 12.

Ramon Caceres, Fred Douglis, Kai Li and Brian Marsh, Operationg System Implications of Solid-State Mobile Computers, article, 7 pgs., Oct. 1993, Workshop on Workstation Operting Systems.

Michael Wu and Wily Zwaenepoel, A Non-Volatile, Main Memory Storage System, 12 pgs., 1994, ACM, San Jose, CA USA.

Dave Bursky, Innovative flash memories match DRAM densities; available with a choice of features, flash memories are finding homes in many systems (includes related articles on the origins of flash, and on the differences between NAND and NOR flash memories). article, May 16, 1994, 9 pgs., Electronic Design, v. 42, n. 10, The Gale Group.

Anthony Cataldo, New flash enhancements up ante. (Intel's 28F400BV-120 and 28F004BV-120, Atmel's AT29BV010 and AT29BV020, and Samsung Semiconductor's KM29V32000 *flash* memory* devices)(Product Announcement), article, Mar. 13, 1995, 4 pgs., Electronic News, v.41, n2056, The Gale Group.

Sam Weber, *Flash* modules' portability, reusability, small size valued for a host of APPs-Consumer formats flocking to *flash*, article, Jul. 22, 1996, 9 pgs., Electronic Engineering Times, n911, CMP Media.

Toshiba, MOS Memory (Non-Volatile), 1995, Data Book.

Stan Baker, But Integration Calls for Hardware, Software Changes: Flash: designers face the dawn of a new memory age, article, Sep. 12, 2003, 5 pgs., Electronic Engineering Times, 1990, N.619, 41, CMP Media.

Toshiba, Toshiba MOS Digital Integrated Circuit Silicon Gate CMOS, (TC58NS512DC) Mar. 21, 2001, 43 pgs., Data Book.

Toshiba Corporation, SMIL (Smartmedia Interface Library) Hardware Edition Version 1.00, Jul. 1, 2000, 36 pgs., Data Book.

Toshiba, Toshiba MOS Digital Integrated Circuit Silicon Gate, (TC58512FT), Mar. 5, 2001, 43 pgs., Data Book.

Toshiba, Toshiba MOS Digital Integrated Circuit Silicon Gate, (TC58DVM92A1FT00), Jan. 10, 2003, 44 pgs., Data Book.

Toshiba, Toshiba MOS Digital Integrated Circuit Silicon Gate, (TC58DVG02A1FT00), Jan. 10, 2003, 44 pgs., Data Book.

Toshiba, Toshiba MOS Digital Integrated Circuit Silicon Gate, (TH58100FT), Mar. 5, 2001, 43 pgs., Data Book.

35Nonvolatile Memory Technology Review, A Time of Change, Proceedings 1993 Conference, Jun. 22-24, 1993, Linthlcum Heights, MD USA.

Toshiba Corporation, SMIL (Smartmedia Interface Library) Software Edition Version 1.00, Jul. 1, 2000, 136 pgs., Data Book.

Toshiba, MOS Memory (Non-Volatile), 1996, 279 pgs., Data Book.

Dan Auclair, Optimal Solid State Disk Architecure for Portable Computers, symposium, Jul. 9, 1991, 7 pgs., SunDisk Corporation.

* cited by examiner

| Actual LBA/ Actual PBA | Virtual PBA | old | used | def |
|---|---|---|---|---|
| 0 | | 0 | 0 | 0 |
| 1 | | 0 | 0 | 0 |
| 2 | | 0 | 0 | 0 |
| 3 | | 0 | 0 | 0 |
| 4 | | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 4*

| Actual LBA/ Actual PBA | Virtual PBA | old | used | def |
|---|---|---|---|---|
| 0 | | 0 | 1 | 0 |
| 1 | | 0 | 0 | 0 |
| 2 | | 0 | 0 | 0 |
| 3 | 0 | 0 | 0 | 0 |
| 4 | | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 5*

| Actual LBA/ Actual PBA | Virtual PBA | old | used | def |
|---|---|---|---|---|
| 0 | | 0 | 1 | 0 |
| 1 | | 0 | 1 | 0 |
| 2 | | 0 | 0 | 0 |
| 3 | 0 | 0 | 0 | 0 |
| 4 | 1 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 6*

| Actual LBA/ Actual PBA | Virtual PBA | old | used | def |
|---|---|---|---|---|
| 0 | | 1 | 1 | 0 |
| 1 | | 0 | 1 | 0 |
| 2 | | 0 | 1 | 0 |
| 3 | 2 | 0 | 0 | 0 |
| 4 | 1 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 7*

| Actual LBA/ Actual PBA | Virtual PBA | old | used | def |
|---|---|---|---|---|
| 0 | | 1 | 1 | 0 |
| 1 | | 1 | 1 | 0 |
| 2 | | 0 | 1 | 0 |
| 3 | 2 | 0 | 1 | 0 |
| 4 | 3 | 0 | 0 | 0 |
| 5 | | 0 | 0 | 0 |
| 6 | | 1 | 1 | 0 |
| 7 | | 0 | 0 | 0 |
| 8 | | 0 | 0 | 0 |
| 9 | | 0 | 0 | 1 |
| 10 | | 0 | 0 | 0 |

*FIG. 8*

DIRECT LOGICAL BLOCK ADDRESSING FLASH MEMORY MASS STORAGE ARCHITECTURE

CROSS REFERENCE TO RELATED APPLICATIONS

This application is a continuation of U.S. patent application Ser. No. 09/850,790, filed on May 7, 2001, now U.S. Pat. No. 6,912,618, issued on Jun. 28, 2005, and entitled"DIRECT LOGICAL BLOCK ADDRESSING FLASH MEMORY MASS STORAGE ARCHITECTURE.," which is a continuation of U.S. application Ser. No. 09/521,420, filed Mar. 8, 2000, now U.S. Pat. No. 6,230,234, issued on May 8, 2001 and entitled "DIRECT LOGICAL BLOCK ADDRESSING FLASH MEMORY MASS STORAGE ARCHITECTURE.," which is a continuation of U.S. application Ser. No. 09/311,045, filed May 13, 1999, now U.S. Pat. No. 6,115,785, issued on Sep. 5, 2000 and entitled "DIRECT LOGICAL BLOCK ADDRESSING FLASH MEMORY MASS STORAGE ARCHITECTURE." which is a continuation of U.S. application Ser. No. 09/087,720, filed May 29, 1998, now U.S. Pat. No. 5,924,113 issued on Jul. 13, 1999, entitled "DIRECT LOGICAL BLOCK ADDRESSING FLASH MEMORY MASS STORAGE ARCHITECTURE." which is a continuation of U.S. application Ser. No. 08/509, 706 filed Jul. 31, 1995 U.S. Pat. No. 5,845,313, issued on Dec. 1, 1998, entitled "DIRECT LOGICAL BLOCK ADDRESSING FLASH MEMORY MASS STORAGE ARCHITECTURE."

FIELD OF THE INVENTION

This invention relates to the field of mass storage for computers. More particularly, this invention relates to an architecture for replacing a hard disk with a semiconductor non-volatile memory and in particular flash memory.

BACKGROUND OF THE INVENTION

Computers conventionally use rotating magnetic media for mass storage of documents, data, programs and information. Though widely used and commonly accepted, such hard disk drives suffer from a variety of deficiencies. Because of the rotation of the disk, there is an inherent latency in extracting information from a hard disk drive.

Other problems are especially dramatic in portable computers. Tin particular, hard disks are unable to withstand many of the kinds of physical shock that a portable computer will likely sustain. Further, the motor for rotating the disk consumes significant amounts of power decreasing the battery life for portable computers.

Solid state memory is an ideal choice for replacing a hard disk drive for mass storage because it can resolve the problems cited above. Potential solutions have been proposed for replacing a hard disk drive with a semiconductor memory. For such a system to be truly useful, the memory must be non-volatile and alterable. The inventors have determined that FLASH memory is preferred for such a replacement.

FLASH memory is a transistor memory cell which is programmable through hot electron, source injection, or tunneling, and erasable through Fowler-Nordheim tunneling. The programming and erasing of such a memory cell requires current to pass through the dielectric surrounding floating gate electrode. Because of this, such types of memory have a finite number of erase-write cycles. Eventually, the dielectric deteriorates. Manufacturers of FLASH cell devices specify the limit for the number of erase-write cycles between 100.000 and 1.000.000.

One requirement for a semiconductor mass storage device to be successful is that its use in lieu of a rotating media hard disk mass storage device be transparent to the designer and the user of a system using such a device. In other words, the designer or user of a computer incorporating such a semiconductor mass storage device could simply remove the hard disk and replace it with a semiconductor mass storage device. All presently available commercial software should operate on a system employing such a semiconductor mass storage device without the necessity of any modification.

SunDisk proposed an architecture for a semiconductor mass storage using FLASH memory at the Silicon Valley PC Design Conference on Jul. 9, 1991. That mass storage system included read-write block sizes of 512 Bytes to conform with commercial hard disk sector sizes.

Earlier designs incorporated erase-before-write architectures. In this process, in order to update a file on the media, if the physical location on the media was previously programmed, it has to be erased before the new data can be reprogrammed.

This process would have a major deterioration on overall system throughput. When a host writes a new data file to the storage media, it provides a logical block address to the peripheral storage device associated with this data file. The storage device then translates this given logical block address to an actual physical block address on the media and performs the write operation. In magnetic hard disk drives, the new data can be written over the previous old data with no modification to the media. Therefore, once the physical block address is calculated from the given logical block address by the controller, it will simply write the data file into that location. In solid state storage, if the location associated with the calculated physical block address was previously programmed, before this block can be reprogrammed with the new data, it has to be erased. In one previous art, in erase-before-write architecture where the correlation between logical block address given by the host is one to one mapping with physical block address on the media. This method has many deficiencies. First, it introduces a delay in performance due to the erase operation before reprogramming the altered information. In solid state flash, erase is a very slow process.

Secondly, hard disk users typically store two types of information, one is rarely modified and another which is frequently changed. For example, a commercial spread sheet or word processing software program stored on a user's system are rarely, if ever, changed. However, the spread sheet data files or word processing documents are frequently changed. Thus, different sectors of a hard disk typically have dramatically different usage in terms of the number of times the information stored thereon is changed. While this disparity has no impact on a hard disk because of its insensitivity to data changes, in a FLASH memory device, this variance can cause sections of the mass storage to wear out and be unusable significantly sooner than other sections of the mass storage.

In another architecture, the inventors previously proposed a solution to store a table correlating the logical block address to the physical block address. The inventions relating to that solution are disclosed in U.S. Pat. No. 5,388,083, issued on Feb. 7, 1995. U.S. Pat. No. 5,479,638 issued on Dec. 26, 1995. Those applications are incorporated herein by reference.

The inventors' previous solution discloses two primary algorithms and an associated hardware architecture for a semiconductor mass storage device. It will be understood that "data file" in this patent document refers to any computer file including commercial software, a user program, word processing software document, spread sheet file and the like. The first algorithm in the previous solution provides means for avoiding an erase operation when writing a modified data file back onto the mass storage device. Instead, no erase is performed and the modified data file is written onto an empty portion of the mass storage.

The semiconductor mass storage architecture has blocks sized to conform with commercial hard disk sector sizes. The blocks arc individually erasable. In one embodiment, the semiconductor mass storage can be substituted for a rotating hard disk with no impact to the user, so that such a substitution will be transparent. Means are provided for avoiding the erase-before-write cycle each time information stored in the mass storage is changed.

According to the first algorithm, erase cycles are avoided by programming an altered data file into an empty block. This would ordinarily not be possible when using conventional mass storage because the central processor and commercial software available in conventional computer systems are not configured to track continually changing physical locations of data files. The previous solution includes a programmable map to maintain a correlation between the logical address and the physical address of the updated information files.

All the flags, and the table correlating the logical block address to the physical block address are maintained within an array of CAM cells. The use of the CAM cells provides very rapid determination of the physical address desired within the mass storage, generally within one or two clock cycles. Unfortunately, as is well known, CAM cells require multiple transistors, typically six. Accordingly, an integrated circuit built for a particular size memory using CAM storage for the tables and flags will need to be significantly larger than a circuit using other means for just storing the memory.

The inventors proposed another solution to this problem which is disclosed in U.S. Pat. No. 5,485,595, issued on Jan. 16, 1996. That application is incorporated herein by reference.

This additional previous solution invented by these same inventors is also for a nonvolatile memory storage device. The device is also configured to avoid having to perform an erase-before-write each time a data file is changed by keeping a correlation between logical block address and physical block address in a volatile space management RAM. Further, this invention avoids the overhead associated with CAM cell approaches which require additional circuitry.

Like the solutions disclosed above by these same inventors, the device includes circuitry for performing the two primary algorithms and an associated hardware architecture for a semiconductor mass storage device. In addition, the CAM cell is avoided in this previous solution by using RAM cells.

Reading is performed in this previous solutions by providing the logical block address to the memory storage. The system sequentially compares the stored logical block addresses until it finds a match. That data file is then coupled to the digital system. Accordingly, the performance offered by this solution suffers because potentially all of the memory locations must be searched and compared to the desired logical block address before the physical location of the desired information can be determined.

What is needed is a semiconductor hard disk architecture which provides rapid access to stored data without the excessive overhead of CAM cell storage.

SUMMARY OF THE INVENTION

The present invention is for a nonvolatile memory storage device. The device is configured to avoid having to perform an erase-before-write each time a data file is changed. Further, to avoid the overhead associated with CAM cells, this approach utilizes a RAM array. The host system maintains organization of the mass storage data by using a logical block address. The RAM array is arranged to be addressable by the same address as the logical block addresses of the host. Each such addressable location in the RAM includes a field which holds the physical address of the data in the nonvolatile mass storage expected by he host. This physical block address information must be shadowed in the nonvolatile memory to ensure that the device will still function after resuming operation after a power down because Rams are volatile memory devices. In addition, status flags are also stored for each physical location. The status flags can be stored in either the nonvolatile media or in both the RAM and in the nonvolatile media.

The device includes circuitry for performing two primary algorithms and an associated hardware architecture for a semiconductor mass storage device. The~~ first algorithm provides a means for mapping of host logical block address to physical block address with much improved performance and minimal hardware assists. In addition, the second algorithm provides means for avoiding an erase-before-write cycle when writing a modified data file back onto the mass storage device. Instead, no era-se is performed and the modified data file is written onto an empty portion of the mass storage.

Reading is performed in the present invention by providing the logical block address to the memory storage. The RAM array is arranged so that the logical block address selects one RAM location. That location contains the physical block address of the data requested by the host or other external system. That data file is then read out to the host.

According to the second algorithm, erase cycles are avoided by programming an altered data file into an empty mass storage block rather than itself after an erase cycle of the block as done on previous arts.

BRIEF DESCRIPTION OF THE DRAWINGS

FIGS. 4 through 8 show the status of several of the flags and information for achieving the advantages of the present invention.

DETAILED DESCRIPTION OF THE PREFERRED EMBODIMENT

Figure 1:
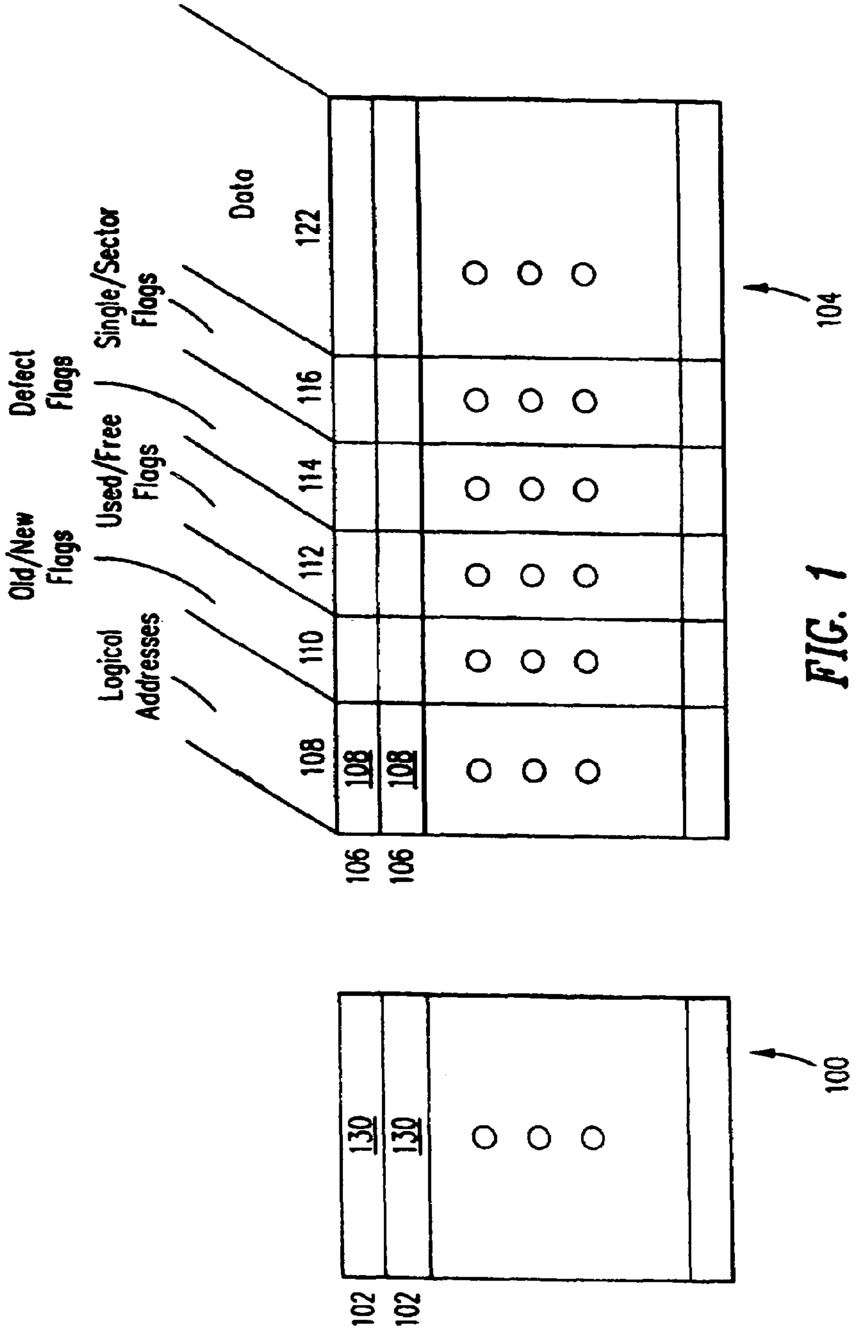
FIG. 1 shows a schematic block diagram of an architecture for a semiconductor mass storage according to the present invention.

FIG. 1 shows an architecture for implementation of a solid state storage media according to the present invention. The storage media is for use with a host or other external digital system. The mass storage is partitioned into two portions, a volatile RAM array 100 and a nonvolatile array 104. According to the preferred embodiment, all of the nonvolatile memory storage is FLASH. The FLASH may be replaced by EEPROM. The RAM can be of any convenient type.

The memory storage 104 is arranged into N blocks of data from zero through N−1. Each of the blocks of data is M Bytes long. In the preferred embodiment, each data block is 512 Bytes long to correspond with a sector length in a commercially available hard disk drive plus the extra numbers of bytes to store the flags and logical block address information and the associated ECC. The memory 104 can contain as much memory storage as a user desires. An example of a mass storage device might include 100 M Byte of addressable storage. There are a plurality of RAM locations 102. Each RAM location 102 is uniquely addressable by controller using an appropriate one of the logical block addresses provided by the host system or the actual physical address of the nonvolatile media. The RAM location 102 contains the physical block address of the data associated with the logical block address and the flags associated with a physical block address on the nonvolatile media.

Figure 2:
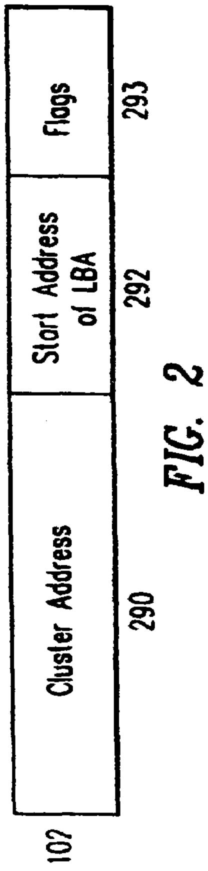
FIG. 2 shows an alternative embodiment to the physical block address 102 of the RAM storage of FIG. 1.

It is possible that the physical block address can be split into two fields as shown in FIG. 2. These fields can be used for cluster addresses of a group of data blocks. The first such field 290 is used to select a cluster address and the second such field 292 can be used to select the start address of the logical block address associated with this cluster.

A collection of information flags is also stored for each nonvolatile memory location 106. These flags include an old/new flag 110, a used/free flag 112, a defect flag, 114, and a single/sector flag 116. Additionally, there is also a data store 122.

When writing data to the mass storage device of the present invention, a controller determines the first available physical block for storing the data. The RAM location 102 corresponding to the logical block address selected by the host is written with the physical block address where the data is actually stored within the nonvolatile memory array in 104 (FIG. 1).

Assume for example that a user is preparing a word processing document and instructs the computer to save the document. The document will be stored in the mass storage system. The host system will assign it a logical block address. The mass storage system of the present invention will select a physical address of an unused block or blocks in the mass storage for storing the document. The address of the physical block address will be stored into the RAM location 102 corresponding to the logical block address. As the data is programmed, the system of the present invention also Sets the used/free flag 112 in 104 and 293 to indicate that this block location is used. One used/free flag 112 is provided for each entry of the nonvolatile array 104.

Later, assume the user retrieves the document, makes a change and again instructs the computer to store the document. To avoid an erase-before-write cycle, the system of the present invention provides means for locating a block having its used/free flag 112 in 100 unset (not programmed) which indicates that the associated block is erased. The system then sets the used/free flag for the new block 112 of 106 and 293 of 100 and then stores the modified document in that new physical block location 106 in the nonvolatile array 104. The address of the new physical block location is also stored into the RAM location 102 corresponding the logical block address, thereby writing over the previous physical block location in 102. Next, the system sets the old/new flag 110 of the previous version of the document indicating that this is an old unneeded version of the document in 110 of 104 and 293 of 100 In this way, the system of the present invention avoids the overhead of an erase cycle which is required in the erase-before-write of conventional systems to store a modified version of a previous document.

Because of RAM array 100 will lose its memory upon a power down condition, the logical block address with the active physical block address in the media is also stored as a shadow memory 108 in the nonvolatile array 104. It will be understood the shadow information will be stored into the appropriate RAM locations 102 by the controller. During power up sequence, the RAM locations in 100 are appropriately updated from every physical locations in 104, by reading the information 106 of 104. The logical address 108 of 106 is used to address the RAM location of 100 to update the actual physical block address associated with the given logical block address. Also since 106 is the actual physical block address associated with the new data 122, the flags 110, 112, 114, and 116 are updated in 293 of 102 with the physical block address of 106 in 100. It will be apparent to one of ordinary skill in the art that the flags can be stored in either the appropriate nonvolatile memory location 106 or in both the nonvolatile memory location and also in the RAM location 102 associated with the physical block address.

During power up, in order to assign the most recent physical block address assigned to a logical block address in the volatile memory 100, the controller will first reads the Flags 110, 112, 114, and 116 portion of the nonvolatile memory 104 and updates the flags portion 293 in the volatile memory 100. Then it reads the logical block address 108 of every physical block address of the nonvolatile media 104 and by tracking the flags of the given physical block address in the volatile memory 100, and the read logical block address of the physical block address in the nonvolatile memory 104, it can update the most recent physical block address assigned to the read logical block address in the volatile memory 100.

Figure 3:
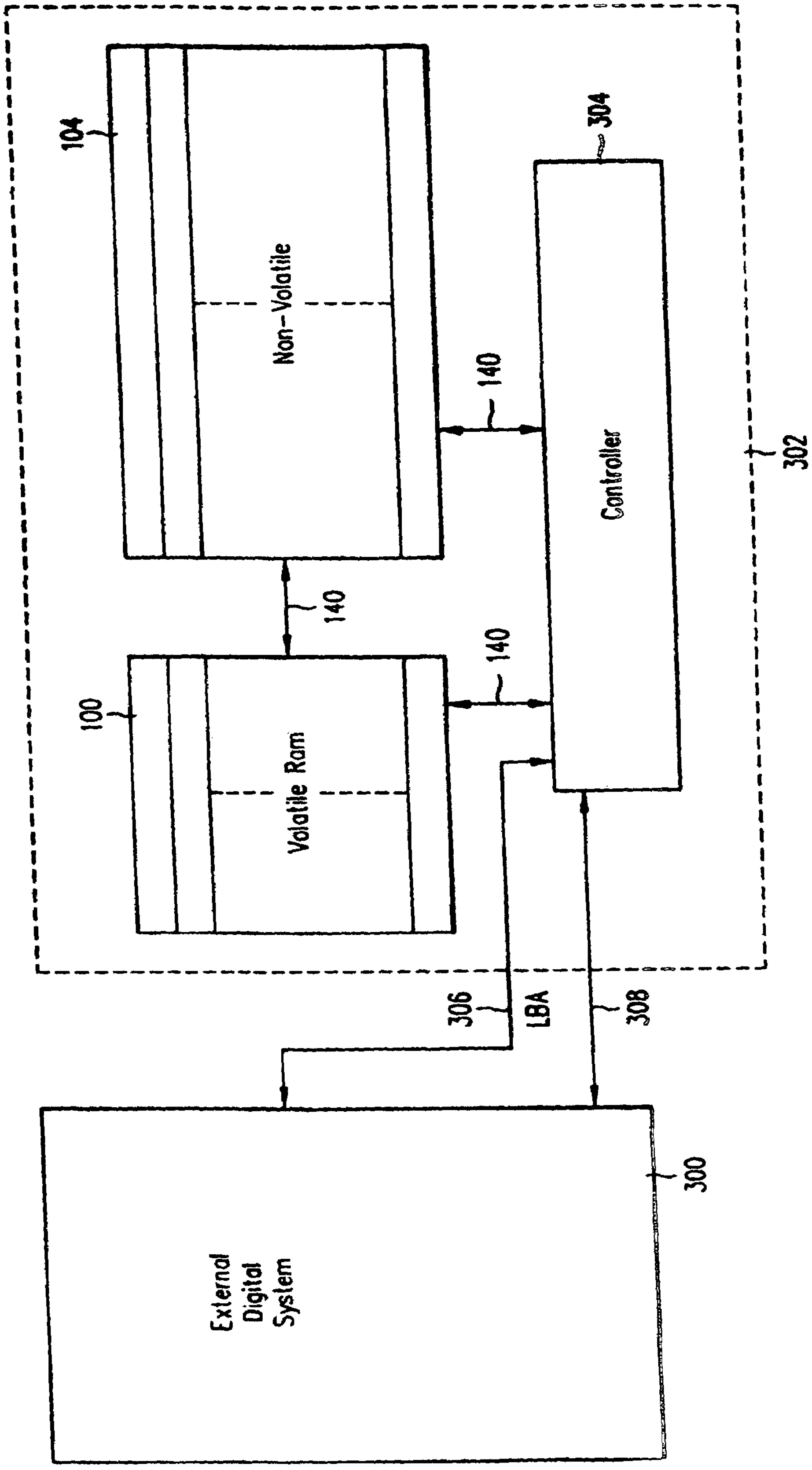
FIG. 3 shows a block diagram of a system incorporating the mass storage device of the present invention.

FIG. 3 shows a block diagram of a system incorporating the mass storage device of the present invention. An external digital system 300 such as a host computer, personal computer and the like is coupled to the mass storage device 302 of the present invention. A logical block address is coupled via an address bus 306 to the volatile RAM array 100 and to a controller circuit 30*t* Control signals are also coupled to the controller 304 via a control bus 308. The volatile RAM array 100 is coupled via data paths 140 for providing the physical block address to the nonvolatile RAM array 104. The controller 304 is coupled to control both the volatile RAM 100, the nonvolatile array 104, and for the generation of all flags.

A simplified example, showing the operation of the write operation according to the present invention is shown in FIGS. 4 through 8. Not all the information flags are shown to avoid obscuring these features of the invention in excessive detail. The data entries are shown using decimal numbers to further simplify the understanding of the invention. It will be apparent to one of ordinary skill in the art that in a preferred embodiment binary counting will be used.

FIG. 4 shows an eleven entry mass storage device according to the present invention. There is no valid nor usable data stored in the mass storage device of FIG. 4. Accordingly, all the physical block addresses are empty. The data stored in the nonvolatile mass storage location '6' is filled and old. Additionally, location '9' is defective and cannot be used.

The host directs the mass storage device of the example to write data pursuant to the logical block address '3' and then to '4' The mass storage device will first write the data associated with the logical block address '3'. The device determines which is the first unused location in the nonvolatile memory. In this example, the first empty location is location '0'. Accordingly, FIG. 5 shows that for the logical block address '3', the corresponding physical block address '0' is stored and the used flag is set in physical block address '0'. The next empty location is location '1'. FIG. 6 shows that for the logical block address '4', the corresponding physical block address '1' is stored and the used flag is set in physical block address '1'.

The host instructs that something is to be written to logical block address '3' again. The next empty location is determined to be location '2'. FIG. 7 shows that the old flag in location '0' is set to indicate that this data is no longer usable, the used flag is set in location '2' and the physical block address in location '3' is changed to '2.

Next, the host instructs that something is to be written to logical block address '4' again. The next empty location is determined to be location '3'. FIG. 8 shows that the old flag in location '1' is set to indicate that this data is no longer usable, the used flag is set in location '3' and the physical block address in location '4' is changed to '3'. (Recall that there is generally no relation between the physical block address and the data stored in the same location.)

Figure 9:
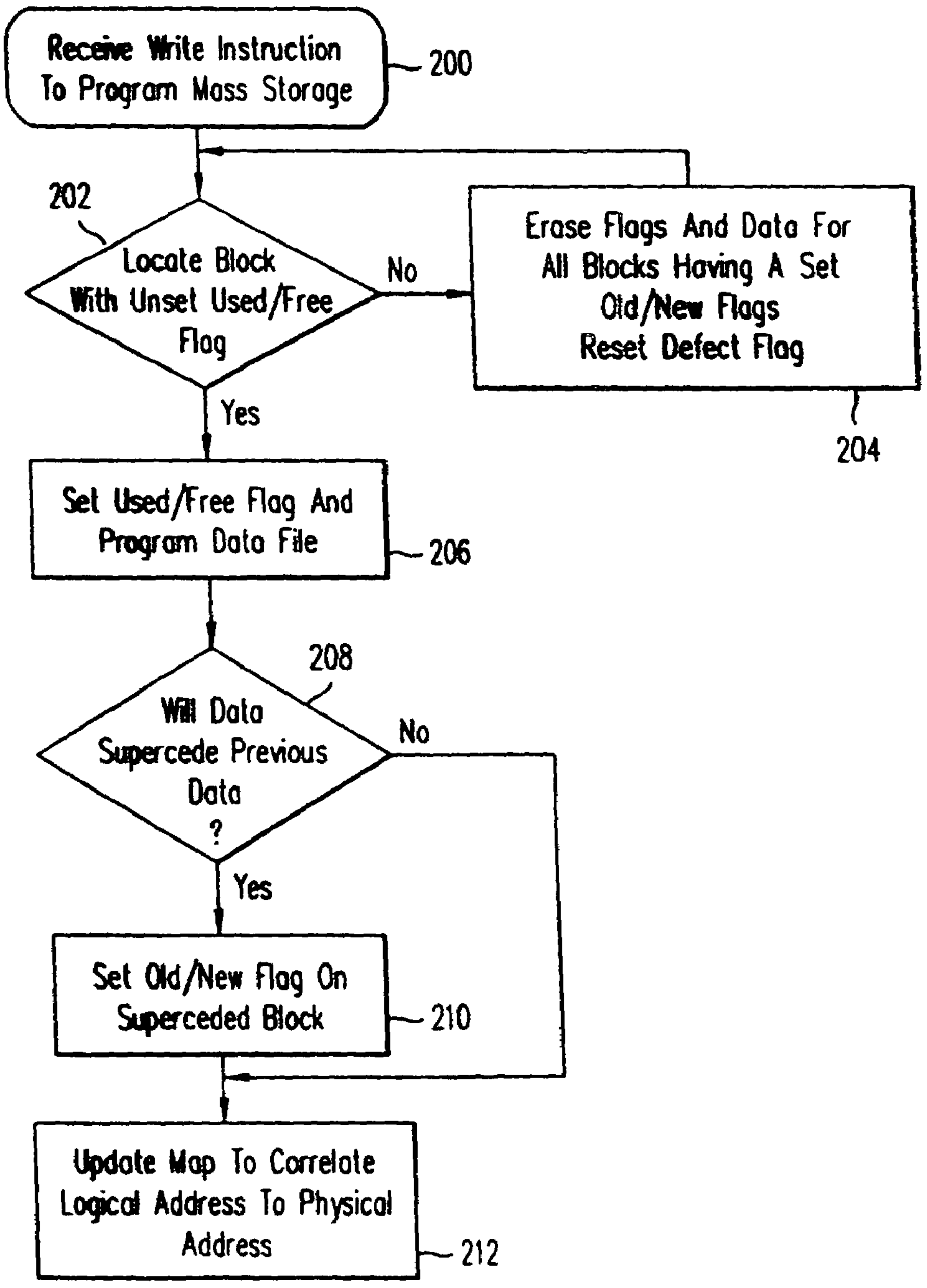
FIG. 9 shows a flow chart block diagram of the first algorithm according to the present invention.

FIG. 9 shows algorithm 1 according to the present invention. When the system of the present invention receives an instruction to program data into the mass storage (step 200), then the system attempts to locate a free block (step 202), i.e., a block having an unset (not programmed) used/free flag. If successful, the system sets the used/free flag for that block and programs the data into that block (step 206).

If on the other hand, the system is unable to locate a block having an unset used/free flag, the system erases the flags (used/free and old/new) and data for all blocks having a set old/new flag and unset defect flag (step 204) and then searches for a block having an unset used/free flag (step 202). Such a block has just been formed by step 204. The system then sets the used/flag for that block and programs the data file into that block (step 206).

If the data is a modified version of a previously existing file, the system must prevent the superseded version from being accessed. The system determines whether the data file supersedes a previous data file (step 208). If so, the system sets the old/new flag associated with the superseded block (step 210). If on the other hand, the data file to be stored is a newly created data file, the step of setting the old/new flag (step 210) is skipped because there is no superseded block. Lastly, the map for correlating the logical address 108 to the physical address 130 is updated (step **2*t*2*i***

By Following the procedure outlined above, the overhead associated with an erase cycle is avoided for each write to the memory 104 except for periodically This vastly improves the performance of the overall computer system employing the architecture of the present invention.

In the preferred embodiment of the present invention, the programming of the flash memory follows the procedure commonly understood by those of ordinary skill in the art. In other words, the program impulses are appropriately applied to the bits to be programmed and then compared to the data being programmed to ensure that proper programming has occurred. In the event that a bit fails to be erased or programmed properly, a defect flag 114 (in FIG. 1) is set which prevent that block from being used again.

The present invention is described relative to a preferred embodiment. Modifications or improvements which apparent to one of ordinary skill in the art after reading this disclosure are deemed within the spirit and scope of this invention.

What we claim is:

1. A storage device having nonvolatile memory coupled to a host, said nonvolatile memory for storing information, the host for generating a plurality of logical block addresses for use in storing or reading information in and from the nonvolatile memory, the storage device comprising:

a volatile memory device having a plurality of volatile memory locations each of which is uniquely addressable by one of the logical block addresses, and wherein each of the volatile memory locations is configured to store a physical block address without requiring the storage of a corresponding logical block address;

one or more nonvolatile memory devices, coupled to the volatile memory, each of said one or more nonvolatile memory devices being organized into a plurality of nonvolatile data blocks, wherein each block is selectively programmable and erasable and further wherein each block is uniquely addressable by one of the physical block addresses; and means for receiving a block of data to be stored in the one or more nonvolatile memory devices, for receiving a target logical block address, for identifying a free particular block within the nonvolatile blocks having no data stored therein, and for storing the physical block address of the particular block in the volatile memory location that corresponds to the target logical block address;

wherein the storage device is adapted to copy information stored in the one or more nonvolatile memory devices which correlate to the physical block addresses of the plurality of nonvolatile data blocks to the volatile memory locations during power-up.

2. The storage device of claim 1, wherein the information copied during power-up comprises information flags and logical block addresses which correlate to the physical block addresses of the nonvolatile data blocks.

3. The storage device of claim 2, wherein the storage device is further adapted to copy the information flags to the volatile memory locations before copying the logical block addresses to the volatile memory locations.

4. The storage device of claim 2, wherein the information flags comprise a flag for indicating whether or not the data block contains data that has been superseded, a flag for indicating whether or not a data block contains valid data, and a flag for indicating whether or not the block is defective.

5. The storage device of claim 1, wherein the means for receiving a block of data to be stored in the one or more nonvolatile memory devices, for receiving a target logical block address, for identifying a free particular block within the nonvolatile blocks having no data stored therein, and for storing the physical block address of the particular block in the volatile memory location that corresponds to the target logical block address is further adapted for storing the block of data in the particular block and for setting an information flag indicating that the particular block is no longer free.

6. The storage device of claim 1, wherein the information stored in the one or more nonvolatile memory devices and correlating to the physical block addresses of the plurality of nonvolatile data blocks is updated during use of the storage device.

7. The storage device of claim 1, wherein the storage device is further adapted to copy the information stored in the one or more nonvolatile memory devices which correlate to the physical block addresses of the plurality of nonvolatile data blocks to the volatile memory locations during a system reset.

8. The storage device of claim 1, further comprising means for addressing one of the plurality of volatile memory locations using a desired logical block addresses, means for retrieving a physical block address stored in the volatile memory location that corresponds to the desired logical block address and means for reading a data block within the nonvolatile memory devices identified by the retrieved physical block address.

9. The storage device of claim 1, further comprising means for coupling the data block read from the nonvolatile memory device to the host.

10. The storage device of claim 1, wherein the target logical block address is stored in the corresponding block of the one or more nonvolatile memory devices.

11. The storage device of claim 1, wherein the volatile memory device comprises a random access memory (RAM) type of memory.

12. The storage device of claim 1, wherein the one or more nonvolatile memory devices comprise flash memory devices.

13. The storage device of claim 1, wherein the volatile memory device is located externally to the means for identifying a free particular block within the nonvolatile blocks having no data stored therein.

14. The storage device of claim 1, wherein the volatile memory device is resident within the means for identifying a free particular block within the nonvolatile blocks having no data stored therein.

15. A storage device having nonvolatile memory coupled to a host, said nonvolatile memory for storing information, the host for generating a plurality of logical block addresses for use in storing or reading information in and from the nonvolatile memory, the storage device comprising:

a volatile memory device having a plurality of volatile memory locations each of which is uniquely addressable by one of the logical block addresses, and wherein each of the volatile memory locations is configured to store a physical block address without requiring the storage of a corresponding logical block address;

one or more nonvolatile memory devices, coupled to the volatile memory, each of said one or more nonvolatile memory devices being organized into a plurality of nonvolatile data blocks, wherein each block is selectively programmable and erasable and further wherein each block is uniquely addressable by one of the physical block addresses; and means for receiving a block of data to be stored in the one or more nonvolatile memory devices, for receiving a target logical block address, for identifying a free particular block within the nonvolatile blocks having no data stored therein, for storing the physical block address of the particular block in the volatile memory location that corresponds to the target logical block address, for storing the block of data in the particular block and for setting an information flag indicating that the particular block is no longer free;

wherein the storage device is adapted to copy information flags and logical block addresses stored in the one or more nonvolatile memory devices which correlate to the physical block addresses of the plurality of nonvolatile data blocks to the volatile memory locations during power-up.

16. The storage device of claim 15, wherein the storage device is further adapted to copy the information flags to the volatile memory locations before copying the logical block addresses to the volatile memory locations.

17. The storage device of claim 15, wherein the information flags comprise a flag for indicating whether or not the data block contains data that has been superseded, a flag for indicating whether or not a data block contains valid data, and a flag for indicating whether or not the block is defective.

18. The storage device of claim 15, wherein the storage device is further adapted to copy the information flags and logical block addresses stored in the one or more nonvolatile memory devices which correlate to the physical block addresses of the plurality of nonvolatile data blocks to the volatile memory locations during a system reset.

19. The storage device of claim 15, further comprising means for addressing one of the plurality of volatile memory locations using a desired logical block addresses, means for retrieving a physical block address stored in the volatile memory location that corresponds to the desired logical block address and means for reading a data block within the nonvolatile memory devices identified by the retrieved physical block address.

20. A storage device having nonvolatile memory coupled to a host, said nonvolatile memory for storing information, the host for generating a plurality of logical block addresses for use in storing or reading information in and from the nonvolatile memory, the storage device comprising:

a volatile memory device having a plurality of volatile memory locations each of which is uniquely addressable by one of the logical block addresses, and wherein each of the volatile memory locations is configured to store a physical block address without requiring the storage of a corresponding logical block address;

one or more nonvolatile memory devices, coupled to the volatile memory, each of said one or more nonvolatile memory devices being organized into a plurality of nonvolatile data blocks, wherein each block is selectively programmable and erasable and further wherein each block is uniquely addressable by one of the physical block addresses; and means for receiving a block of data to be stored in the one or more nonvolatile memory devices, for receiving a target logical block address, for identifying a free particular block within the nonvolatile blocks having no data stored therein, for storing the physical block address of the particular block in the volatile memory location that corresponds to the target logical block address, for storing the block of data in the particular block and for setting an information flag indicating that the particular block is no longer free;

wherein the storage device is adapted to copy information flags and logical block addresses stored in the one or more nonvolatile memory devices which correlate to the physical block addresses of the plurality of nonvolatile data blocks to the volatile memory locations during power-up;

wherein the storage device is further adapted to copy the information flags to the volatile memory locations before copying the logical block addresses to the volatile memory locations; and wherein the information flags comprise a flag for indicating whether or not the data block contains data that has been superseded, a flag for indicating whether or not a data block contains valid data, and a flag for indicating whether or not the block is defective.

21. The storage device of claim 20, wherein the storage device is further adapted to copy the information flags and logical block addresses stored in the one or more nonvolatile memory devices which correlate to the physical block addresses of the plurality of nonvolatile data blocks to the volatile memory locations during a system reset.

22. The storage device of claim 20, further comprising means for addressing one of the plurality of volatile memory locations using a desired logical block addresses, means for retrieving a physical block address stored in the volatile memory location that corresponds to the desired logical block address and means for reading a data block within the nonvolatile memory devices identified by the retrieved physical block address.

* * * * *